United States Patent [19]

Yamamoto et al.

[11] Patent Number: 4,937,836
[45] Date of Patent: Jun. 26, 1990

[54] SEMICONDUCTOR LASER DEVICE AND PRODUCTION METHOD THEREFOR

[75] Inventors: Saburo Yamamoto, Uda; Hiroshi Kayashi, Souraku; Taiji Morimoto, Nara; Seiki Yano, Kashihara, all of Japan

[73] Assignee: Sharp Kabushiki Kaisha, Osaka, Japan

[21] Appl. No.: 675,849

[22] Filed: Nov. 28, 1984

[30] Foreign Application Priority Data

Nov. 30, 1983 [JP] Japan .................................. 58-228124
Dec. 6, 1983 [JP] Japan .................................. 58-231685

[51] Int. Cl.$^5$ ................................................ H01S 3/19
[52] U.S. Cl. ..................................................... 372/48
[58] Field of Search ........................ 372/44, 45, 46, 48

[56] References Cited

FOREIGN PATENT DOCUMENTS 0067588 12/1982 European Pat. Off. .
2400784 7/1979 France .
0080889 2/1983 Japan .
0131786 8/1983 Japan .
2027261 3/1980 United Kingdom .

Primary Examiner—William L. Sikes
Assistant Examiner—Georgia Y. Epps

[57] ABSTRACT

A semiconductor laser device, includes (1) a first semiconductor layer having a mesa-shaped stripe, (2) a current blocking layer applied on the first semiconductor layer except the top of the mesa-shaped stripe of the first semiconductor layer, the current blocking layer allowing the electric current to flow only through the mountain-shaped region, (3) a first cladding layer applied on the current blocking layer and on the top of the mountain-shaped stripe of the first semiconductor layer, and having charge carriers of the same type with that of the first semiconductor layer, (4) an active layer applied on the first cladding layer, and (5) a second cladding layer applied on the active layer, and having charge carriers of the type opposite to that of the first cladding layer, wherein the first cladding layer, the active layer and the second cladding layer compose a multilayer structure of the double heterojunction type for the laser excitation. The first cladding layer is thin so that the laser light excited in the active layer reaches the current blocking region that is outside the mesa-shaped region while it hardly reaches the first semiconductor layer through the mesa-shaped region.

8 Claims, 3 Drawing Sheets

SEMICONDUCTOR LASER DEVICE AND PRODUCTION METHOD THEREFOR

FIELD OF THE INVENTION

The present invention relates to a semiconductor laser device wherein the laser action takes place stably in the fundamental transverse mode and in the longitudinal multimode up to a high output power, and to a production method therefor.

BACKGROUND OF THE INVENTION

Prior-art semiconductor laser devices are classified into the gain waveguide channel type and the refractive index waveguide channel type in terms of the structure of the waveguide thereof. The structure and the characteristics of the types of semiconductor laser devices will be described in the following.

Three types of double heterojunction (DH) semiconductor lasers of the gain waveguide channel type are shown in FIGS. 1-3. In those semiconductor lasers, the current channel is limited narrowly in a stripe 10, 11, 12 for the current injection so that the transverse fundamental mode of the laser oscillation is stabilized and the threshold value of the driving current for the laser excitation is lowered.

Those semiconductor lasers shown in FIGS. 1-3 are fundamentally produced as follows. On a substrate 1 of GaAs, a first cladding layer 2, an active layer 3, a second cladding layer 4, and a cap layer 5 are deposited successively. Then, electrodes 6, 7 are deposited on both surfaces of the semiconductor laser device. The stripe (metal oxide stripe) 10 shown in FIG. 1 is formed by removing a stripe-like region of an oxide layer 13 deposited on the cap layer 5. The stripe (planar stripe) 11 shown in FIG. 2 is a stripe-like diffusion region 14 formed so as to attain the interior of the second cladding layer 4 through the cap layer 5; the diffusion region 14 has charge carriers of the type opposite to that of the cap layer 5. The stripe (inner stripe) 12 shown in FIG. 3 is formed by depositing a current blocking layer 15 on the substrate 1 and by removing a stripe-like region thereof by etching which has charge carriers of the type opposite to that of the substrate 1.

In the excitation of the laser, the stripes 10, 11, 12, each forming the current channel, confine the electric current flowing into the active layer 3 thereinside; the multilayer structure of the GaAs-AlGaAs system having a double heterojunction which consists of the first cladding layer 2, the active layer 3 and the second cladding 4 confines the laser light in the active layer 3. The effective refractive index is nearly constant in the multilayer structure, and a gain waveguide channel is formed.

FIGS. 4(A), 4(B) show far-field patterns of a semiconductor laser of the type shown in FIG. 1; the far-field pattern of FIG. 4(A) is obtained in the case that the width S of the stripe 10 is as wide as about 10 micrometers while the far-field pattern of FIG. 4(B) is obtained in the case that the width S of the stripe 10 is as narrow as about 4 micrometers. The far-field pattern is defined as the amplitude of the laser light observed away from the laser device in the plane parallel to the double heterojunction, as is well known to those skilled in the art; the zero degree of the angle in FIG. 4(A) or 4(B) corresponds to the center of the stripe 10. When the width S is as narrow as about 4 micrometers (FIG. 4(B)), the far-field pattern has double peaks, while when S becomes as wide as 10 micrometers, a large central peak superposes the abovementioned two peaks. FIG. 4(C) shows an example of the distribution of the longitudinal transverse mode of the laser oscillation of the semiconductor laser of the type shown in FIG. 1. It is apparent that the laser light oscillates in the longitudinal multimode.

The semiconductor laser of the gain waveguide channel type has the following characteristics. (1) The laser light is apt to oscillate in the longitudinal multimode. (2) The beam waist in the direction parallel to the junction lies at a position inside the end surface of the resonator by 20-40 micrometers. (3) The fundamental transverse mode of the laser oscillation is liable to become unstable by the injection current. (4) If the width of the stripe for the current injection is narrowed to an order of about 4 micrometer, the laser light oscillates in the so-called leaky mode, and the far-field pattern in the plane parallel to the junction is changed into the double-peak pattern as shown in FIG. 4(B). As for the output characteristics, the longitudinal mode varies from the multimode to the single mode at a relatively low output power with increase in output power, and the output power is saturated at a higher value by the hole burning phenomena of charge carriers.

FIG. 5 shows a CSP laser, as an example of a DH semiconductor laser of the refractive index waveguide channel type. A groove 16 of the width W is formed on a surface of a substrate 1. Then, a first cladding layer 2, an active layer 3, a second cladding layer 4 and a cap layer 5 are deposited successively on the substrate 1. A channel 17 of the width S for the current injection is formed by diffusing impurities into a stripe-like region of the cap layer 5 above the groove 16 down to the second cladding layer 4.

The thickness of the first cladding layer 2 is made so thin outside the groove 16 that the light excited in the active layer 3 leaks through the first cladding layer 2 to reach to the substrate 1. The effective refractive index of the active layer 3 of the multilayer structure of the DH type is lowered at the outside of the groove 16 by the leak effect of the light so that a refractive index waveguide channel of the light is formed.

FIG. 6(A) and FIG. 6(B) show a far-field pattern in the direction parallel to the junction and an example of the distribution of the longitudinal transverse mode, respectively, of the CSP laser shown in FIG. 5. The far-field pattern shown in FIG. 6(A) has a single peak in contrast to those of a semiconductor laser of the gain waveguide channel type shown in FIGS. 4(A), (B). The longitudinal mode of the laser oscillation shown in FIG. 6(B) consists of a substantially single wavelength in contrast to the longitudinal multimode of a semiconductor laser of the gain waveguide channel type shown in FIG. 4(C).

In general, a semiconductor laser of the refractive index waveguide channel type has the following characteristics. (1) The laser light oscillates in a longitudinal single mode. (2) The beam waist in the direction parallel to the junction lies near the end surface of the resonator. (3) The transverse mode is stable. (4) the far-field pattern has a single peak, and the shift of the peak is small.

The comparison between the laser characteristics mentioned above suggests that a semiconductor laser of the refractive index waveguide channel type is superior to that of the gain waveguide channel type. However, the former has a disadvantage in that longitudinal mode partition noise is liable to arise. This noise is caused by the transitions from the single mode to other modes at different wavelengths. Such transitions are caused when the output of the laser light is changed, when the temperature of the device is changed, and when the output of the laser light is fedback by even a slight amount to the device, for example by the reflection at an optical part of the laser system. The longitudinal mode partition noise has relatively low frequencies from a few MHz to 10 MHz, and makes the signal-to-noise ratio of the output light of a laser decrease down to about 70 dB. Therefore, the existence of the longitudinal mode partition noise has been a large obstacle against the enhancement of the output power, and makes it difficult for a semiconductor laser to be applied to the light source of a video disc player.

It is known that, in a semiconductor laser which oscillates in the longitudinal multimode, the increase in noise owing to the longitudinal mode partition noise and the light feedback is not remarkable. However, a semiconductor laser of the gain waveguide channel type which oscillates in the longitudinal multimode cannot be applied in practical use owing to the above-mentioned disadvantages such as the instability of the fundamental transverse mode.

The inventors directed their attention to a possibility that a semiconductor laser having characteristics different from those of prior-art semiconductor lasers will be realized if the current distribution is made narrower than that of the light intensity in the direction parallel to the active layer by narrowing the width of the stripe to an order of 2 micrometers. In such a semiconductor laser, the laser light will be able to oscillate in the longitudinal multimode up to a relative high output power, and in the transverse fundamental mode up to a high output power A semiconductor laser having characteristics mentioned above can be applied to various uses because such noises as the longitudinal mode partition noise and the light feedback noise are negligibly small.

However, a semiconductor laser structure where the distribution of the current is narrower than that of the light is difficult to be realized according to structures employed in prior-art semiconductor lasers. It is difficult to narrow the stripes 10, 11, 12 for the confinement of the injection current, to be less than about 2 micrometers because of such problems as the technical limits of photolithography, side etching and diffusion in the lateral directions.

It is an object of the present invention to provide a semiconductor laser device wherein the laser light can oscillate in the longitudinal multimode and in the transverse fundamental mode up to a high output power.

It is another object of the invention to provide a production method therefor.

A semiconductor laser device according to the invention comprises (1) a first semiconductor layer having a mesa-shaped stripe, (2) a current blocking layer applied on said first semiconductor layer except the top of the mesa-shaped stripe of the first semiconductor layer, (3) a first cladding layer applied on the current blocking layer and on the top of the mesa-shaped stripe of the first semiconductor layer, and having charge carriers of the same type with that of the first semiconductor layer, (4) an active layer applied on the first cladding layer, and (5) a second cladding layer applied on the active layer, and having charge carriers of the type opposite to that of the first cladding layer, wherein the first cladding layer, the active layer and the second cladding layer compose a multilayer structure of the double heterojunction type for laser excitation.

A production method of a semiconductor laser device having an inner stripe according to the invention comprises the steps of (1) forming two parallel grooves on one surface of a substrate, (2) depositing a current blocking layer on the substrate, (3) forming a groove in the current blocking layer, at the bottom of which the flat top of the mesa-shaped region defined between said two grooves on the substrate is exposed, (4) depositing a first cladding layer on the current blocking region including the groove thereof, (5) depositing an active layer on the first cladding layer, and (6) depositing a second cladding layer on the active layer.

An advantage of a semiconductor laser device according to the invention is that the laser a occurs in the longitudinal multimode and in the transverse fundamental mode at the same time up to a high output power.

An advantage of a production method of a semiconductor laser device according to the invention is that an inner stripe having the width less than 2 micrometer can be formed easily.

DETAILED DESCRIPTION OF THE EMBODIMENTS

Figure 7:
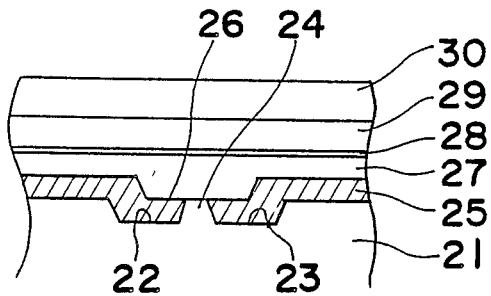
FIG. 7 is a schematic cross-sectional view of a semiconductor laser of the gain waveguide channel type according to a first embodiment of the present invention.
Figure 8:
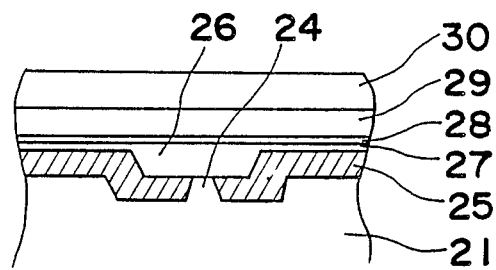
FIG. 8 is a schematic cross-sectional view of a laser according to a second embodiment of the present invention.

Two semiconductor laser devices are shown in FIGS. 7 and 8. They are produced as follows. Two parallel stripe-like grooves 22, 23 are formed on a surface of a substrate 21 so as to form an inner stripe 24 defined between the grooves 22, 23. A current blocking layer 25 is applied on the substrate 21; it is made either of a semiconductor material having charge carriers of the type opposite to that of the substrate 21 or of a material having a high resistivity. A groove 26 is formed over the grooves 22, 23 of the substrate 21 so that the flat top of the mesa-shaped inner stripe 24 defined between the grooves 22, 23 forms a portion of the bottom of the groove 26. Then, a first cladding layer 27 is deposited on the current blocking layer 24 including the groove 26. The thickness of the layer 27 is made different between the two lasers shown in FIGS. 7 and 8 as will be explained later. Next, an active layer 28, a second cladding layer 29 and a cap layer 30 are applied successively on the first cladding layer 27. Then, electrodes (not shown) are each applied on the cap layer 30 and the substrate 21. In the semiconductor laser having the structure shown in FIG. 7 or 8, the inner stripe 24 for the current injection is formed as a mesa-shaped stripe of the substrate 21 which has a flat top surface.

In FIG. 7, the thickness of the first cladding layer 27 is made so thick that the laser light excited in the active layer 28 does not reach the current blocking layer 25. Thus, a semiconductor laser of the gain waveguide channel type is realized.

In FIG. 8, the first cladding layer 27 is made so thin at the outside region of the groove 26 that the laser light excited in the active layer 28 reaches the current blocking layer 25 at the outside region of the inner stripe 24, but not inside the inner stripe 24. The variation of the thickness of the first cladding layer 27 causes the effective refractive index of the active layer 28 to vary also in the direction perpendicular to the groove 26 in the plane parallel to the junction so that a light waveguide channel is formed. A semiconductor laser of this type is named as a broad-channel substrate inner stripe (BSIS) laser because of the broadness of the waveguide channel, which makes it possible to obtain a high output power.

Figure 9:
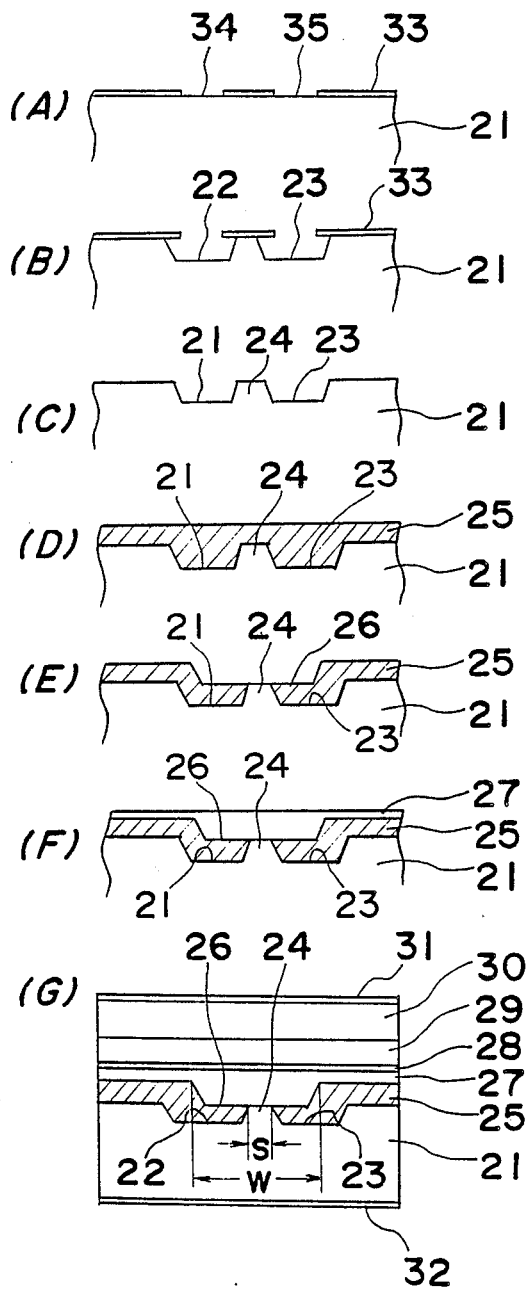
FIGS. 9(A)–(G) are schematic cross-sectional views for showing steps of producing a semiconductor laser according to the invention, respectively.

A process of producing a BSIS laser composed of compounds of the GaAs-AlGaAs system will be explained hereafter. As shown in FIG. 9(A), AZ resist 33 is painted on a (100) plane of p-GaAs substrate 21. Two parallel lines of stripe windows 34 and 35 each of 3 micrometer in width are formed in the AZ resist 33 by using a photolithography process: the distance between the neighboring sides of the stripe windows 34 and 35 is set to be 2.5 micrometer. Then, as shown in FIG. 9(B), two parallel grooves 22, 23 are formed by etching the p-GaAs substrate 21. In this process, an etchant consisting of $H_2SO_4$, $H_2O_2$ and $H_2O$ mixed in volume ratio of 1:2:50 is painted through the stripe windows 34, 35. The grooves 22, 23 are etched to the depth of 1 micrometer. The width of each of the groove 22, 23 is widened from 3 micrometer to 4 micrometer because of the side etching effect so that the width between the grooves 22, 23, that is, the width of the inner stripe 24 is narrowed from 2.5 micrometer to 1.5 micrometer. Next, as shown in FIG. 9(C), the AZ resist layer 33 is removed. Then, as shown in FIG. 9(D), a current blocking layer 25 of n-GaAs of carrier concentration of $3 \times 10^{18}$ cm$^{-3}$ is grown on the substrate 21 up to the thickness of 0.8 micrometer outside the grooves 22, 23 by using the liquid phase epitaxy process. Next, as shown in FIG. 9(E), a groove 26 is formed in the current blocking layer 25 at the region above the grooves 22, 23 in such a manner that the inner stripe 24 is positioned at the center of the groove 26. In this process, the groove 26 is deepened until the flat top of the mesa-shaped stripe 24 is exposed. Then, as shown in FIG. 9(F), a first cladding layer 27 of p-$Al_{0.45}Ga_{0.55}As$ is formed on the current blocking layer 25 including the top of the mesa-shaped stripe 24 by using LPE. The thickness of the first cladding layer 27 is 0.2 micrometer in the regions outside the groove 26. Next, an active layer 28 of p-$Al_{0.15}Ga_{0.85}As$ of 0.08 micrometer in thickness, a second cladding layer 29 of n-$Al_{0.45}Ga_{0.55}As$ of 1.0 micrometer in thickness and a cap layer 30 of n-GaAs of 3.0 micrometer in thickness are formed successively by using LPE. Finally, an electrode 31 of Au-Ge-Ni and an electrode 32 of Au-Zn are deposited on the cap layer 30 and on the rear surface of the substrate 21, respectively, and both electrodes 31, 32 are then heated for alloying. Thus, a BSIS laser having the width of 8 micrometers of the waveguide channel and the stripe width of 1.5 micrometers for the current injection is produced, as shown in FIG. 9(G).

In the process of producing the inner stripe, the width S of the mesa-shaped stripe 24 can very easily be made less than 2.0 micrometer by adopting a double-groove structure as shown in FIG. 8 and by using the side etching on the formation of the groove 22, 23. On the other hand, it should be remembered that it is hard for the stripes 10, 11, 12 in prior-art semiconductor lasers to have a width of less than 2.0 micrometers. In an embodiment of the semiconductor laser produced according to the abovementioned process, the laser light oscillated at the wavelength of 780 nm, and the threshold current for the laser excitation was 40 mA; the so-called I-L kink did not appear up to 50 mW in the output power, and the longitudinal multimode was kept up to 15 mW; and the external differential efficiency was 30% per one surface.

A well known CSP laser (FIG. 5) has a similar waveguiding action to that of the semiconductor laser of the refractive waveguide channel type according to the invention. However, the laser light excited in the CSP laser oscillates in the longitudinal single mode because the width of the stripe for the current injection is broad.

As for the gain waveguide channel type shown in FIG. 7, a high output power was obtained in the longitudinal multimode because the width S of the inner stripe 24 can be made less than 2 micrometers.

The laser action of the BSIS laser according to the present invention varies with the width S of the inner stripe 24 and the width W of the groove 26. If the width W of the groove 26 is made to be much wider than the width S of the inner stripe 24, the effect o+the waveguide owing to the variation of the refractive index near the groove 26 becomes weak, and the distribution or the refractive index of the active layer 28 is governed by the variation of the concentration of minor carriers injected through the inner stripe 22 and accumulated in the active layer 28. (The refractive index decreases with increase in carrier concentration.) That is, a semiconductor laser of the gain waveguide channel type is realized.

Figure 5:
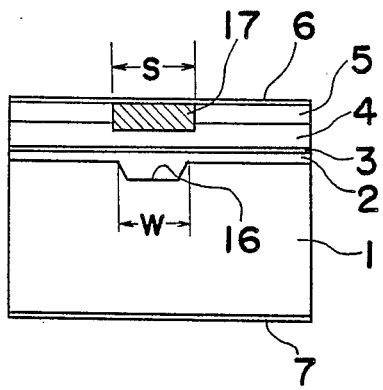
FIG. 5 is a schematic cross-sectional view of a CSP laser.

On the other hand, if the width W is made to be of the same order or narrower than the width S, the distribution of the effective refractive index in the active layer 28 is affected little by the charge carriers accumulated in the active layer 28 so that a complete refractive index waveguide channel is formed near the groove 26. That is, a semiconductor laser of the refractive index waveguide channel type as shown in FIG. 5 is realized.

Thus, by controlling the widths W and S, both types of a semiconductor laser can be realized.

In addition, a semiconductor laser of a new type can also be realized wherein the laser light oscillates up to a high output power in the fundamental transverse mode stably and in the longitudinal multimode, as will be explained hereinafter.

Figure 1:
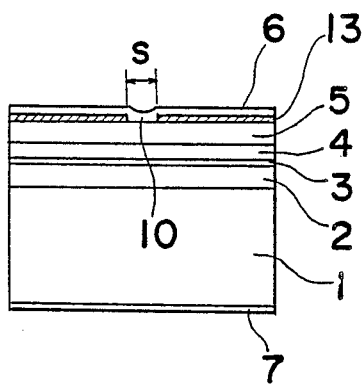
FIG. 1 is a schematic cross-sectional view of a semiconductor laser having an oxide stripe.
Figure 2:
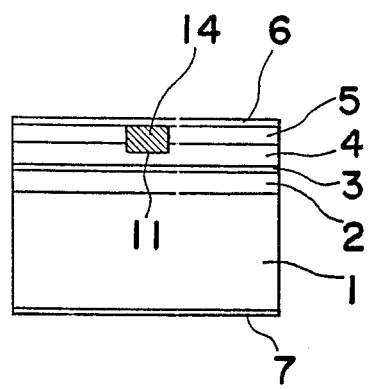
FIG. 2 is a schematic cross-sectional view of a semiconductor laser having a planar stripe.
Figure 3:
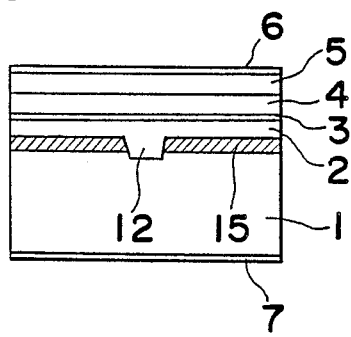
FIG. 3 is a schematic cross-sectional view of a semiconductor laser having an inner stripe.
Figure 4A:
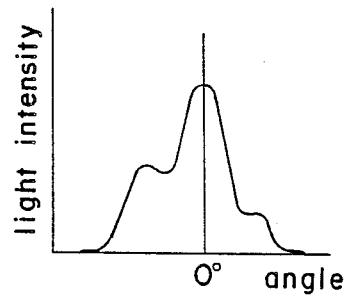
FIG. 4(A) and FIG. 4(B) are graphs of a far-field pattern of semiconductor lasers wherein the width of a stripe is about 10 micrometers and about 4 micrometers, respectively.
Figure 4B:
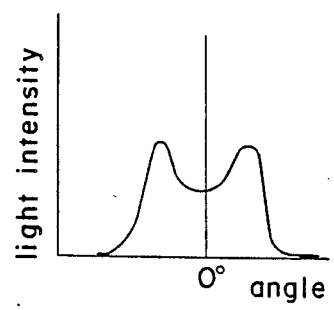
Figure 4C:
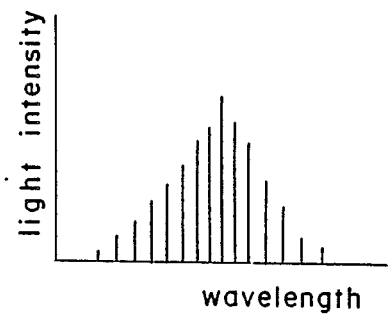
FIG. 4(C) is a graph of the longitudinal mode of the laser oscillation.
Figure 6A:
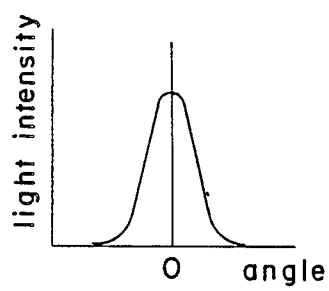
FIG. 6(A) and FIG. 6(B) are graphs which show a far-field pattern and the longitudinal mode of the CSP laser shown in FIG. 5, respectively.
Figure 6B:
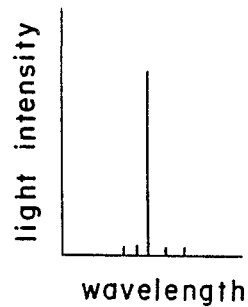
Figure 10A:
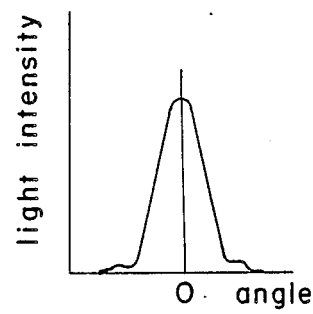
FIG. 10(A) and FIG. 10(B) are graphs showing a far-field pattern and the longitudinal mode of a semiconductor laser, respectively.
Figure 10B:
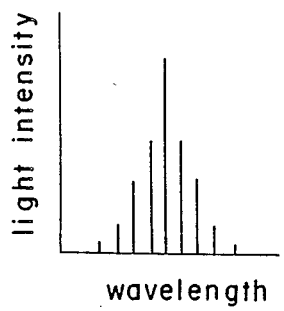

If the width W of the groove 26 is made larger above 2S, the far-field pattern changes gradually from a signal peak (FIG. 6(A)) of a semiconductor laser of the refractive index waveguide channel type to double peaks (FIG. 4(B)) of the gain waveguide channel type, and the longitudinal mode of the light oscillation changes gradually from the single mode (FIG. 6(B)) of the former to the multimode (FIG. 4(C)) of the latter. At the same time, the beam waist in the direction parallel to the junction moves gradually inward from the end surface. If $W>5S$, the transverse mode becomes unstable, as expected for a semiconductor laser of the gain waveguide channel type. Therefore, it is preferable that W and S satisfy the relation $2S<W<5S$. It is also preferable that W is 8 micrometer or less in order to suppress the occurrence of the transverse high order mode. FIGS. 10(A), (B) show the far-field pattern in the direction parallel to the junction and the longitudinal mode, respectively, of a semiconductor laser of the intermediate type. The far-field pattern shown in FIG. 10(A) has a single peak superposed with small double peaks. The longitudinal mode (FIG. 10(B)) is multiple, but the distribution of the oscillation frequencies is rather limited when compared with that of a semiconductor laser of the gain waveguide channel type.

An embodiment of a semiconductor laser of the abovementioned new type is produced in a similar procedure to that of the semiconductor laser shown in FIGS. 9(A)–(G). The differences of the procedure from the latter are as follows. The distance between the window stripes 34, 35 in the AZ resist layer 33 is made to be 3 micrometer. Then, after the formation of the grooves 22,23 of 0.8 micrometer in depth by the etching, the width S of the mesa-shaped stripe 24 of the substrate 21 is narrowed to 2 micrometers. The thickness of the first cladding layer 27 is made to be 0.2 micrometer outside the grooves 22, 23.

In the semiconductor laser thus produced, the laser light oscillated at the wavelength of 780 nm, and the threshold current for the laser excitation was 60 mA; it outputs the light up to 20 mW stably in the fundamental transverse mode and up to 15 mW in the longitudinal multimode. The application of this semiconductor laser device to the signal light source of a video disc player allows us to reproduce a good picture because no noises such as the longitudinal mode partition noise and the light feedback noise arise.

A DH type semiconductor laser device according to the present invention can be realized not only as a laser of the GaAs-AlGaAs system but also as a laser of the InP-InGaAsP and other systems.

This invention may be practiced or embodied in still other ways without departing from the spirit or essential character thereof. The preferred embodiments described herein are therefore illustrative and not restrictive, the scope of the invention is indicated by the appended claims and all variations which come within the meaning of the claims are intended to be embraced therein.

We claim:
1. In a semiconductor laser device, comprising:
a first semiconductor layer having a first conductivity type charge carrier and having at least two grooves in a first surface, said grooves forming a first mesa-shaped region between them on said first surface, said first mesa-shaped region having a top surface;
a current blocking layer applied on said first surface of said first semiconductor layer and having a groove disposed over said top surface of said first mesa-shaped region of said first semiconductor layer said groove having a width greater than said first mesa-shaped region, said current blocking layer restricting an electric current so as to flow only through said first mesa-shaped region;
a first cladding layer applied on said current blocking layer including in said groove in said current blocking layer thereby being disposed on said top surface of said first mesa-shaped region of said first semiconductor layer, said first cladding layer having charge carriers of the same conductivity type as that of said first semiconductor layer, the width of the top surface of said first mesa-shaped region of said first semiconductor layer being narrower than a width of a surface of a second mesa-shaped region of said first cladding layer formed by said first cladding layer disposed in said groove in said current blocking layer, said surface of said second mesa-shaped region being in contact with said top surface of said first mesa-shaped region of said first semiconductor layer;
an active layer applied on said first cladding layer; and
a second cladding layer applied on said active layer said second cladding layer having charge carriers of a conductivity type opposite to that of the charge carriers of said first cladding layer,
wherein said first cladding layer, said active layer and said second cladding layer compose a multilayer structure of a double heterojunction type for laser excitation, said first cladding layer being thin at those areas of said first cladding layer covering said current blocking layer so that laser light excited in said active layer reaches said current blocking region outside said second mesa-shaped region of said first cladding layer while the laser light being not capable of reaching said semiconductor layer through said second mesa-shaped region.

2. In a semiconductor laser device, comprising:
a first semiconductor layer having a first conductivity type charge carrier and having at least two grooves in a first surface, said grooves forming a first mesa-shaped region between them on said first surface, said first mesa-shaped region having a top surface;
a current blocking layer applied on said first surface of said first semiconductor layer and having a groove disposed over said top surface of said first mesa-shaped region of said first semiconductor layer said groove having a width greater than said first mesa-shaped region, said current blocking layer restricting an electric current so as to flow only through said first mesa-shaped region;
a first cladding layer applied on said current blocking layer including in said groove in said current blocking layer thereby being disposed on said top surface of said first mesa-shaped region of said first semiconductor layer, said first cladding layer having charge carriers of the same conductivity type as that of said first semiconductor layer, the width of the top surface of said first mesa-shaped region of said first semiconductor layer being narrower than a width of a surface of a second mesa-shaped region of said first cladding layer formed by said first cladding layer disposed in said groove in said current blocking layer, said surface of said second mesa-shaped region being in contact with said top surface of said first mesa-shaped region of said first semiconductor layer;

an active layer applied on said first cladding layer; and a second cladding layer applied on said active layer said second cladding layer having charge carriers of a conductivity type opposite to that of the charge carriers of said first cladding layer, wherein said first cladding layer, said active layer and said second layer compose a multilayer structure of a double heterojunction type for laser excitation, said first cladding layer being thin at those areas of said first cladding layer covering said current blocking layer so that laser light excited in said active layer reaches said current blocking region outside said second mesa-shaped region of said first cladding layer while the laser light being not capable of reaching said first semiconductor layer through said second mesa-shaped region;

said width S of said top surface of said first mesa-shaped region of said first semiconductor layer and said width W of said surface of said second mesa-shaped region of said first cladding layer satisfy a relation 2S W 5S.

3. The semiconductor laser device according to claim 2, wherein said width W of the said surface of said second mesa-shaped region of said first cladding layer is 8 micrometers or less.

4. The semiconductor laser device of claim 3, wherein said width S of said top surface of said mesa-shaped region of said first semiconductor layer is less than 2 micrometers.

5. The semiconductor laser device of claim 2 wherein said first semiconductor layer includes GaAs.

6. The semiconductor laser device of claim 5 wherein said first cladding layer and said active layer includes AlGaAs.

7. The semiconductor laser device of claim 2 wherein said first semiconductor layer includes InP.

8. The semiconductor laser device of claim 7 wherein said first cladding layer and said active layer include InGaAsP.

* * * * *